(12) United States Patent
Avila et al.

(10) Patent No.: US 9,183,086 B2
(45) Date of Patent: *Nov. 10, 2015

(54) SELECTION OF DATA FOR REDUNDANCY CALCULATION IN THREE DIMENSIONAL NONVOLATILE MEMORY

(71) Applicant: SanDisk Technologies Inc., Plano, TX (US)

(72) Inventors: Chris Nga Yee Avila, Saratoga, CA (US); Gautam Ashok Dusija, Milpitas, CA (US); Jian Chen, Menlo Park, CA (US); Yingda Dong, San Jose, CA (US); Man Lung Mui, Fremont, CA (US); Seungpil Lee, San Ramon, CA (US); Alexander Kwok-Tung Mak, Los Altos Hills, CA (US)

(73) Assignee: SanDisk Technologies Inc., Plano, TX (US)

( * ) Notice: Subject to any disclaimer, the term of this patent is extended or adjusted under 35 U.S.C. 154(b) by 216 days.

This patent is subject to a terminal disclaimer.

(21) Appl. No.: 13/908,905

(22) Filed: Jun. 3, 2013

(65) Prior Publication Data

US 2014/0359398 A1    Dec. 4, 2014

(51) Int. Cl.
| | |
|---|---|
| *G11C 29/00* | (2006.01) |
| *G06F 11/10* | (2006.01) |
| *G11C 29/04* | (2006.01) |
| *G06F 12/02* | (2006.01) |
| *G11C 16/34* | (2006.01) |
| *G11C 16/04* | (2006.01) |

(52) U.S. Cl.
CPC ........ *G06F 11/1068* (2013.01); *G06F 12/0246* (2013.01); *G11C 16/349* (2013.01); *G11C 29/04* (2013.01); *G11C 29/82* (2013.01); *G11C 16/0483* (2013.01); *G11C 2213/71* (2013.01)

(58) Field of Classification Search
CPC ............ G06F 11/1068; G06F 12/0246; G06F 11/3034; G06F 11/3055
See application file for complete search history.

(56) References Cited

U.S. PATENT DOCUMENTS

| | | |
|---|---|---|
| 5,070,032 A | 12/1991 | Yuan et al. |
| 5,095,344 A | 3/1992 | Harari |
| 5,200,350 A | 4/1993 | Gill et al. |
| 5,238,855 A | 8/1993 | Gill |
| 5,313,421 A | 5/1994 | Guterman et al. |
| 5,315,541 A | 5/1994 | Harari et al. |
| 5,343,063 A | 8/1994 | Yuan et al. |
| 5,570,315 A | 10/1996 | Tanaka et al. |
| 5,595,924 A | 1/1997 | Yuan et al. |
| 5,661,053 A | 8/1997 | Yuan |
| 5,663,901 A | 9/1997 | Wallace et al. |
| 5,671,239 A | 9/1997 | Higashitani et al. |

(Continued)

OTHER PUBLICATIONS

Office Action for U.S. Appl. No. 14/281,243 mailed Dec. 23, 2014, 19 pages.

(Continued)

*Primary Examiner* — Esaw Abraham
(74) *Attorney, Agent, or Firm* — Davis Wright Tremaine LLP

(57) ABSTRACT

Portions of data stored in a three dimensional memory array are selected based on their locations for calculation of redundancy data. Locations are selected so that no two portions in a set of portions for a given calculation are likely to become uncorrectable at the same time. Selected portions may be separated by at least one word line and separated by at least one string in a block.

38 Claims, 13 Drawing Sheets

(56) References Cited

U.S. PATENT DOCUMENTS

| | | | |
|---|---|---|---|
| 5,768,192 | A | 6/1998 | Eitan |
| 5,903,495 | A | 5/1999 | Takeuchi et al. |
| 5,907,171 | A | 5/1999 | Santin et al. |
| 6,011,725 | A | 1/2000 | Eitan |
| 6,046,935 | A | 4/2000 | Takeuchi et al. |
| 6,222,762 | B1 | 4/2001 | Guterman et al. |
| 7,733,720 | B2 * | 6/2010 | Joshi et al. .................. 365/201 |
| 8,472,257 | B2 | 6/2013 | Dong et al. |
| 8,830,717 | B2 | 9/2014 | Avila et al. |
| 8,832,373 | B2 * | 9/2014 | Colgrove et al. ............ 711/114 |
| 8,868,825 | B1 * | 10/2014 | Hayes et al. .................. 711/103 |
| 8,891,303 | B1 | 11/2014 | Higgins et al. |
| 2005/0160217 | A1 * | 7/2005 | Gonzalez et al. ................ 711/6 |
| 2011/0267885 | A1 | 11/2011 | Kato |
| 2012/0001247 | A1 | 1/2012 | Alsmeier |
| 2012/0220088 | A1 | 8/2012 | Alsmeier |
| 2013/0107628 | A1 | 5/2013 | Dong et al. |

OTHER PUBLICATIONS

Office Action for U.S. Appl. No. 14/285,052 mailed Dec. 19, 2014, 15 pages.

U.S. Appl. No. 13/801,741 entitled "Weighted Read Scrub for Nonvolatile Memory," filed Mar. 3, 2013, 45 pages.

U.S. Appl. No. 13/791,200 entitled "Optimized Configurable NAND Parameters," filed Mar. 8, 2013, 37 pages.

U.S. Appl. No. 61/731,198, filed Nov. 29, 2012, 32 pages.

U.S. Appl. No. 61/731,215, filed Nov. 29, 2012, 42 pages.

U.S. Appl. No. 14/064,823, filed Oct. 28, 2013, 48 pages.

U.S. Appl. No. 14/064,887, filed Oct. 28, 2013, 42 pages.

U.S. Appl. No. 13/908,905, filed Jun. 13, 2013, 48 pages.

Notification of Transmittal of the International Search Report and the Written Opinion of the International Searching Authority, or the Declaration for Int'l Appl. No. PCT/US2014/036545 mailed Oct. 21, 2014, 14 pages.

Park et al., A Fully Performance Compatible 45 mn 4-Gigabit Three Dimensional Double-Stacked Multi-Level NAND Flash Memory with Shared Bit-Line Structure, IEEE Journal of Solid-State Circuits, vol. 44, No. 1, Jan. 2009, pp. 208-216.

Eitan et al., "NROM: A Novel Localized Trapping, 2-Bit Nonvolatile Memory Cell," IEEE Electron Device Letters, vol. 21, No. 11, Nov. 2000, pp. 543-545.

Office Action for U.S. Appl. No. 14/064,887 mailed Feb. 27, 2015, 15 pages.

Notice of Allowance issued for U.S. Appl. No. 14/064,887 mailed on Jun. 22, 2015, 17 pages.

Notice of Allowance issued for U.S. Appl. No. 14/281,243 mailed on Apr. 13, 2015, 14 pages.

Notice of Allowance issued for U.S. Appl. No. 14/285,052 mailed on May 1, 2015, 5 pages.

* cited by examiner

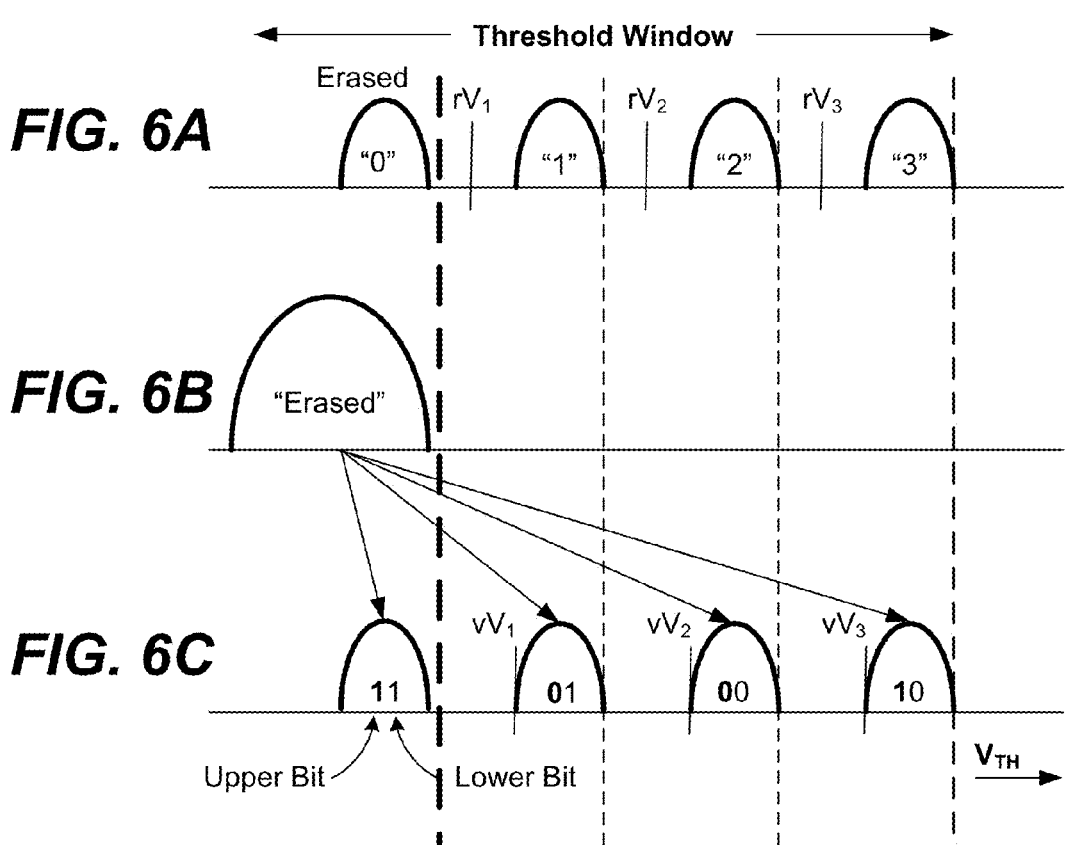
Programming into four states represented by a 2-bit code

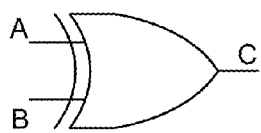
FIG. 10
| A | B | C |
|---|---|---|
| 0 | 0 | 0 |
| 1 | 0 | 1 |
| 0 | 1 | 1 |
| 1 | 1 | 0 |
FIG. 11
| A | 01100110 |
|---|----------|
| B | 10001101 |
| C | 11101011 |
FIG. 12
| X | 01100110 |
|---|----------|
| Y | 10001101 |
| Z | 11001100 |
| XOR(X,Y,Z) | 00100111 |
FIG. 13
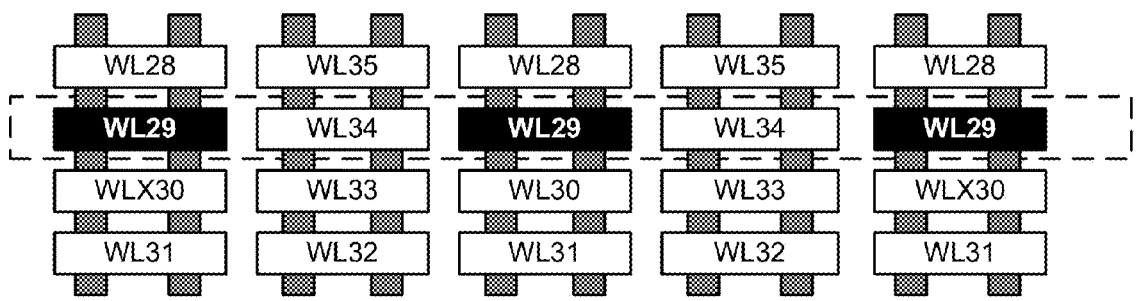
FIG. 14A

SELECTION OF DATA FOR REDUNDANCY CALCULATION IN THREE DIMENSIONAL NONVOLATILE MEMORY

BACKGROUND

This application relates to the operation of three dimensional re-programmable non-volatile memory systems and to systems and methods for dealing with data errors in such memory systems.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page are read or programmed together.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

SUMMARY OF THE INVENTION

In order to recover data that may become uncorrectable when read from a three dimensional nonvolatile memory, redundancy data is calculated for a set of portions of data. Portions of data are selected for a given set according to their physical locations within the three dimensional memory array. In particular, locations may be selected so that no two portions in a set are likely to become uncorrectable at the same time. Selected portions within a block may be separated by at least one word line and separated by at least one string. Selected portions in different blocks may be selected so that no two portions are in blocks that share block select circuits.

An example of a method of operating a three dimensional nonvolatile NAND memory in which an individual block contains a plurality of NAND strings connected to each bit line, and in which word lines of different strings along a bit line are connected together, includes: receiving portions of data to be stored in the three dimensional nonvolatile NAND memory array; assigning the portions of data to physical locations for storage in the three dimensional nonvolatile NAND memory array, an individual portion assigned to a location defined by: (i) a block, (ii) a plurality of bit lines that serve the block, (iii) a set of strings selected from a plurality of sets of strings connected to the plurality of bit lines in the block, and (iv) a word line coupled to the set of strings; selecting a set of two or more portions of data for calculation of redundancy data, the two or more portions of data selected according their assigned physical locations so that none of the two or more portions of data are assigned to connected word lines of different sets of strings of an individual block; and calculating redundancy data for the set of two or more portions of data, the redundancy data calculated from the set of two or more portions of data so that any individual portion of the two or more portions can be calculated from the redundancy data and portions of the set of data other than the individual portion.

The set of two or more portions of data may be selected according to their assigned locations so that none of the two or more portions of data are assigned to neighboring sets of strings. The redundancy data may be stored at a physical location that is along a word line that is not connected to a word line containing any of the two or more portions of data. Calculating the redundancy data may be performed by an exclusive OR (XOR) operation applied to the set of two or more portions of data. Selecting of the set of two or more portions may select only portions that are assigned to word lines of the individual block that are vertically separated by at least one intermediate word line. Redundancy data may be stored at a physical location along a word line that is vertically separated by at least one intermediate word line from any word line along which a portion of the set is stored. The portions of data may be encoded according to an Error Correction Coding (ECC) scheme prior to storing the portions of data in the three dimensional nonvolatile NAND memory array. The method may also include: storing the set of data and the redundancy data in the three dimensional nonvolatile NAND memory; subsequently reading a first portion of data of the set of data from the three dimensional nonvolatile NAND memory; attempting to decode the read first portion of data using ECC decoding; determining that the read first portion of data is uncorrectable by ECC; and in response, calculating the first portion of data from the redundancy data and the set of data portions other than the first portion. The two or more portions of data may consist of 3 or 4 portions of data that are subject to an XOR operation to calculate the redundancy data.

An example of a three dimensional nonvolatile NAND memory system includes: a plurality of individually erasable blocks of memory cells, an individual block containing a plurality of vertical NAND strings along each bit line, each of the plurality of vertical NAND strings served by word lines that are connected to word lines of other vertical NAND strings of the plurality of vertical NAND strings; redundancy calculation circuits that calculate redundancy data from a set of portions of data so that any portion of data in the set can be reproduced from the other portions of data in the set and the redundancy data; and data selecting circuits that select portions of data to form sets for calculation of redundancy data according to their physical locations so that no two portions in a set are assigned to word lines that are connected together.

The data selecting circuits may be further configured to select portions of data to form sets for calculation of redundancy data according to their physical locations so that no two portions in a set are assigned to neighboring sets of strings in a block. The data selecting circuits may select portions of data for calculation of redundancy data according to their physical locations so that selected portions are from unconnected word lines that are vertically separated by at least one intermediate word line. The redundancy calculation circuits may be exclusive OR (XOR) circuits. The system may also include ECC circuits. The system may include additional erase blocks that are dedicated for storage of redundancy data. Individual erase blocks may contain a mix of redundancy data and other data.

An example of a method of operating a three dimensional nonvolatile NAND memory in which an individual block contains multiple NAND strings connected to each bit line, and in which word lines of different strings along a bit line in a block are connected together, includes: pairing neighboring NAND blocks so that an unselected NAND block of a pair of NAND blocks is subject to a set of boosting voltages when accessing a selected NAND block of the pair of NAND blocks; and applying a selection scheme for selecting sets of portions of data for calculating redundancy data, each portion of data in a set selected from a different block that is not paired with any block containing any other portion of data in the set.

The method may also include: encoding the portions of data according to an ECC scheme prior to storing the portions of data in the three dimensional nonvolatile NAND memory array; calculating redundancy data for each set of portions of data; storing the portions of data and the redundancy data in the three dimensional nonvolatile NAND memory; subsequently reading a portion of data from the three dimensional nonvolatile NAND memory; and in response to determining that the read first portion of data is uncorrectable by ECC, calculating the first portion of data from the redundancy data and portions of data other than the portion. The calculation of the redundancy data may be performed prior to the encoding the portions of data according to an ECC scheme. Calculating of redundancy data may be performed by an XOR operation applied to the set of portions of data.

An example of a three dimensional nonvolatile NAND memory system includes: a plurality of individually erasable blocks of memory cells, an individual block containing a plurality of vertical NAND strings along each bit line, each of the plurality of vertical NAND strings served by word lines that are connected to word lines of other vertical NAND strings of the plurality of vertical NAND strings; block select circuits that connect pairs of neighboring blocks to global word lines at the same time, a selected block that connects to first global word lines and an unselected block that is paired with the selected block and that connects to second global word lines; redundancy calculation circuits that calculate redundancy data from a set of portions of data so that any portion of data can be reproduced from the other portions of data in the set and the redundancy data; and data selecting circuits that select portions of data to form sets for calculation of redundancy data according to their physical locations so that no two portions in a set are assigned to the same block, or to neighboring blocks that form a pair.

The redundancy calculation circuits may include an XOR circuit that calculates XOR data from the set of portions of data. The system may also include ECC circuits. Each of the portions of data may represent all data of a corresponding block, and portions of data selected to form a set may be selected so that none of the blocks corresponding to the portions of data share block select circuits.

An example of a method of operating a three dimensional nonvolatile NAND memory in which an individual block contains a plurality of NAND strings connected to each bit line, and in which word lines of different strings along a bit line are connected together includes: receiving portions of data to be stored in the three dimensional nonvolatile NAND memory array; assigning the portions of data to physical locations for storage in the three dimensional nonvolatile NAND memory array, an individual portion assigned to a location defined by: (i) a block, (ii) a plurality of bit lines that serve the block, (iii) a set of strings selected from a plurality of sets of strings connected to the plurality of bit lines in the block, and (iv) a word line coupled to the set of strings; selecting a set of two or more portions of data for calculation of redundancy data, the two or more portions of data selected according their assigned physical locations so that none of the two or more portions of data are assigned to neighboring sets of strings in a block; and calculating redundancy data for the set of two or more portions of data, the redundancy data calculated from the set of two or more portions of data so that any individual portion of the two or more portions can be calculated from the redundancy data and portions of the set of data other than the individual portion.

The redundancy data may be stored at a physical location in a set of strings so that none of the two or more portions of data are assigned to neighboring sets of strings. Calculating the redundancy data may be performed by an exclusive OR (XOR) operation applied to the set of two or more portions of data. Selecting the set of two or more portions may select only portions that are assigned to word lines of the individual block that are vertically separated by at least one intermediate word line. The redundancy data may be stored at a physical location along a word line that is vertically separated by at least one intermediate word line from any word line along which a portion of the set is stored. The portions of data may be encoded according to an Error Correction Coding (ECC) scheme prior to storing the portions of data in the three dimensional nonvolatile NAND memory array. The method may further include: storing the set of data and the redundancy data in the three dimensional nonvolatile NAND memory; subsequently reading a first portion of data of the set of data from the three dimensional nonvolatile NAND memory; attempting to decode the read first portion of data using ECC decoding; determining that the read first portion of data is uncorrectable by ECC; and in response, calculating the first portion of data from the redundancy data and the set of data portions other than the first portion. The two or more portions of data may consist of 3 or 4 portions of data that are subject to an XOR operation to calculate the redundancy data.

An example of a three dimensional nonvolatile NAND memory system may include: a plurality of individually erasable blocks of memory cells, an individual block containing a plurality of vertical NAND strings along each bit line, each of the plurality of vertical NAND strings served by word lines that are connected to word lines of other vertical NAND strings of the plurality of vertical NAND strings; redundancy calculation circuits that calculate redundancy data from a set of portions of data so that any portion of data in the set can be reproduced from the other portions of data in the set and the redundancy data; and data selecting circuits that select portions of data to form sets for calculation of redundancy data according to their physical locations so that no two portions in a set are assigned to neighboring sets of strings in a block.

The data selecting circuits may select portions of data for calculation of redundancy data according to their physical locations so that selected portions are from unconnected word lines that are vertically separated by at least one intermediate word line. The redundancy calculation circuits may be exclusive OR (XOR) circuits. The system may also include ECC circuits. The system may include additional erase blocks that are dedicated for storage of redundancy data. Individual erase blocks may contain a mix of redundancy data and other data.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIGS. 6A-6C illustrate an example of programming a population of 4-state memory cells.

FIG. 10 shows an Exclusive OR (XOR) circuit.

FIG. 11 shows a truth table for an XOR operation.

FIG. 12 illustrates XORing of portions of data to obtain redundancy data.

FIG. 13 illustrates XORing of more than two portions of data to obtain redundancy data.

FIG. 14A illustrates an example of a failure mode in a 3-D memory array.

DETAILED DESCRIPTION

Memory System

Figure 1:
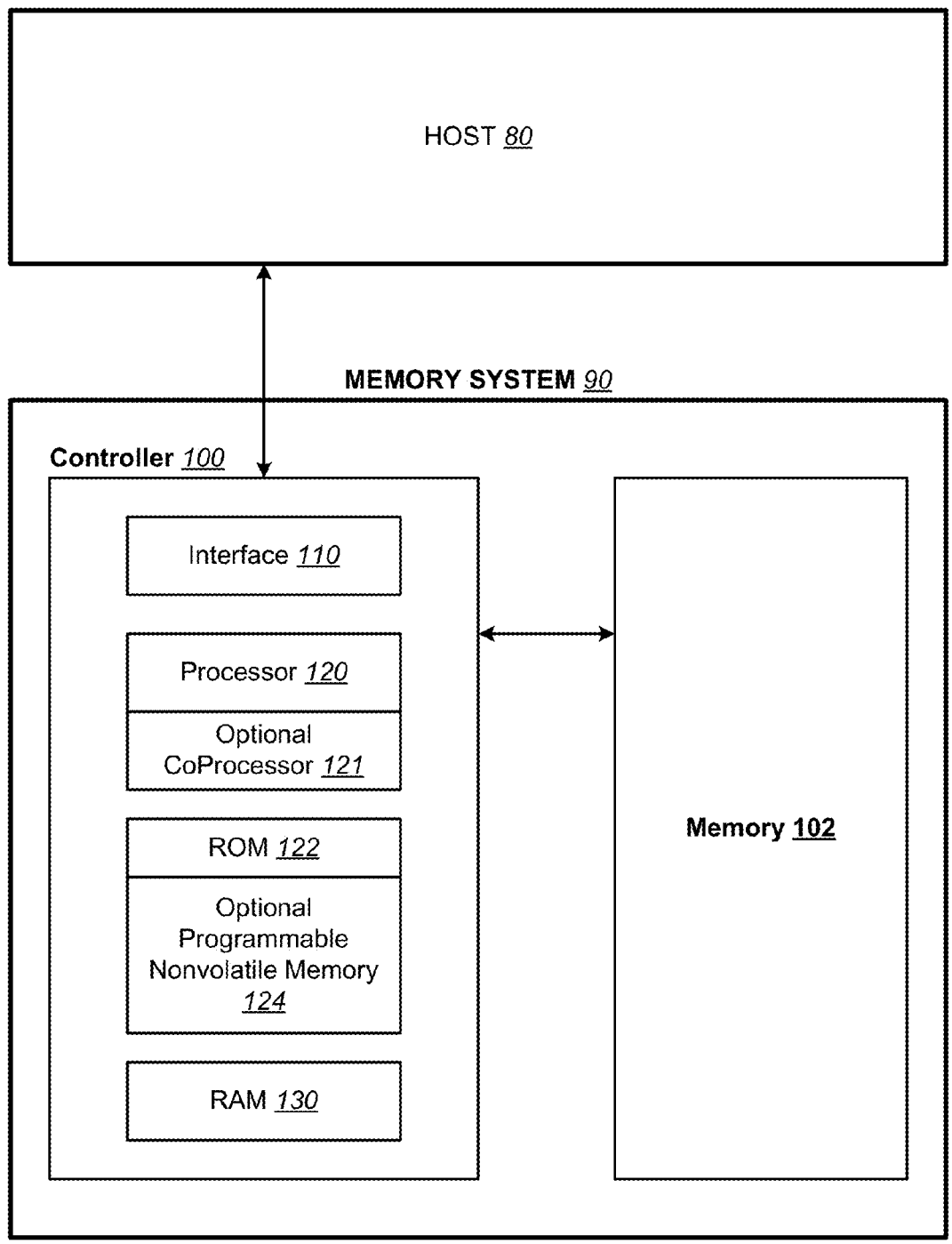
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system is typically in the form of a memory card or an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. A controller is typically formed as an ASIC (application specific integrated circuit) and the components included in such an ASIC generally depend on the particular application.

Physical Memory Structure

Figure 2:
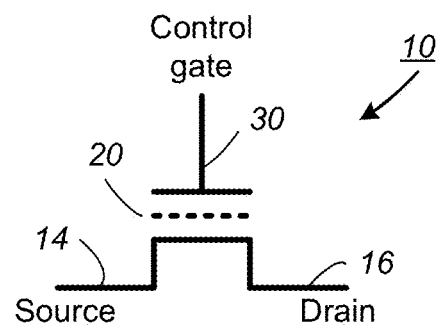
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661, 053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
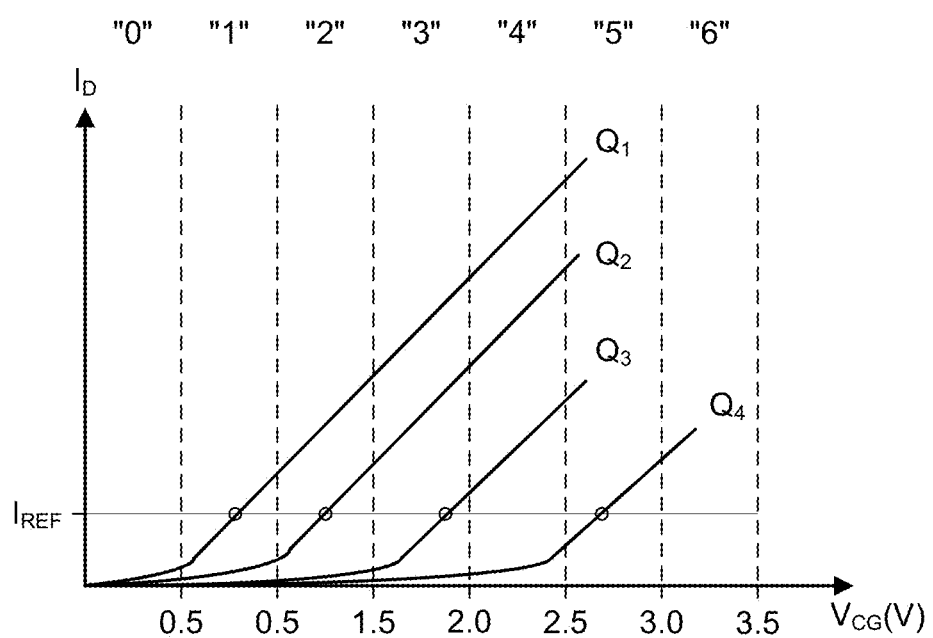
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four charge levels that can be programmed on a floating gate of a memory cell, respectively corresponding to four of eight possible memory states. As an example, the threshold voltage window of a population of cells may range from 0.5V to 3.5V. Seven programmed memory states "0", "1", "2", "3", "4", "5", "6", respectively, and one erased state (not shown), may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
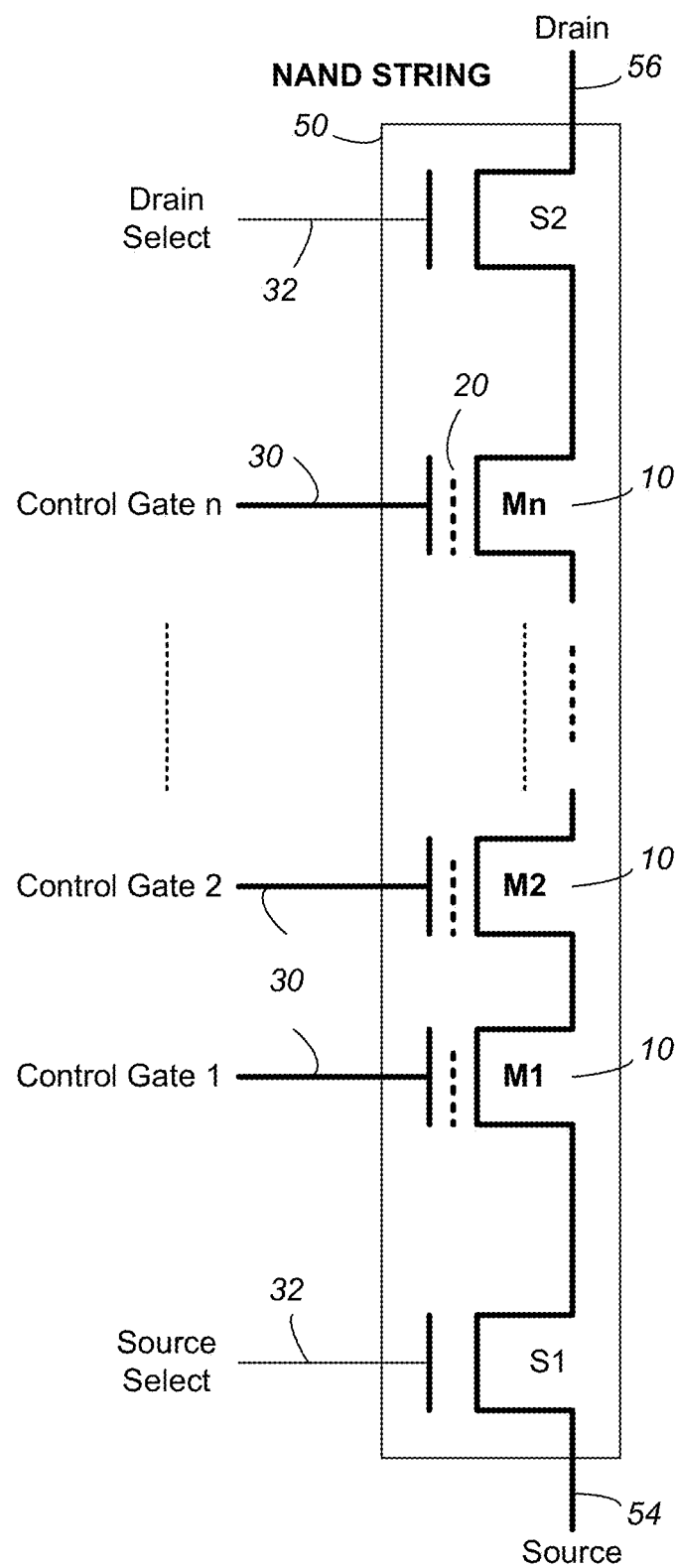
FIG. 4A illustrates schematically a string of memory cells organized into a NAND string.

FIG. 4A illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
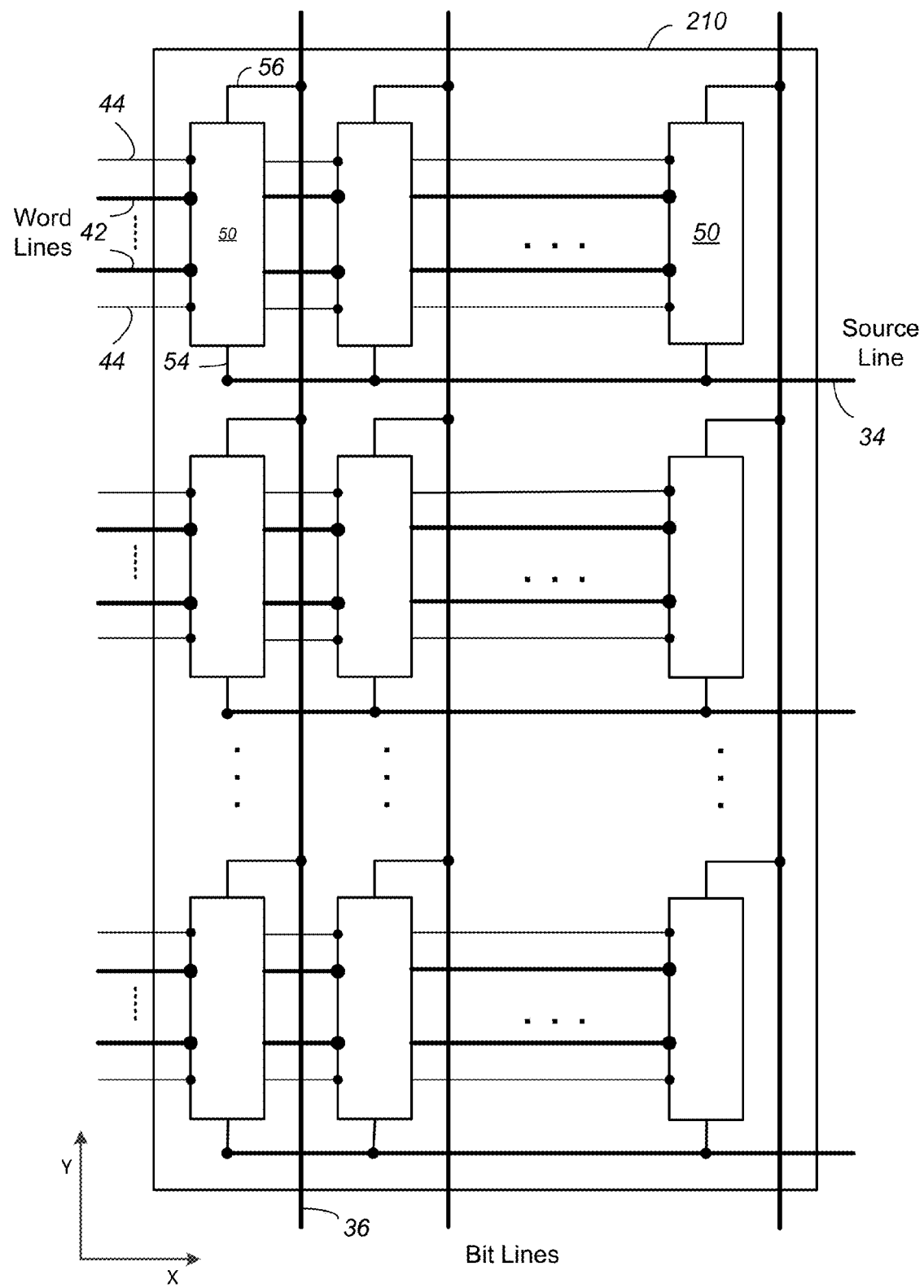
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
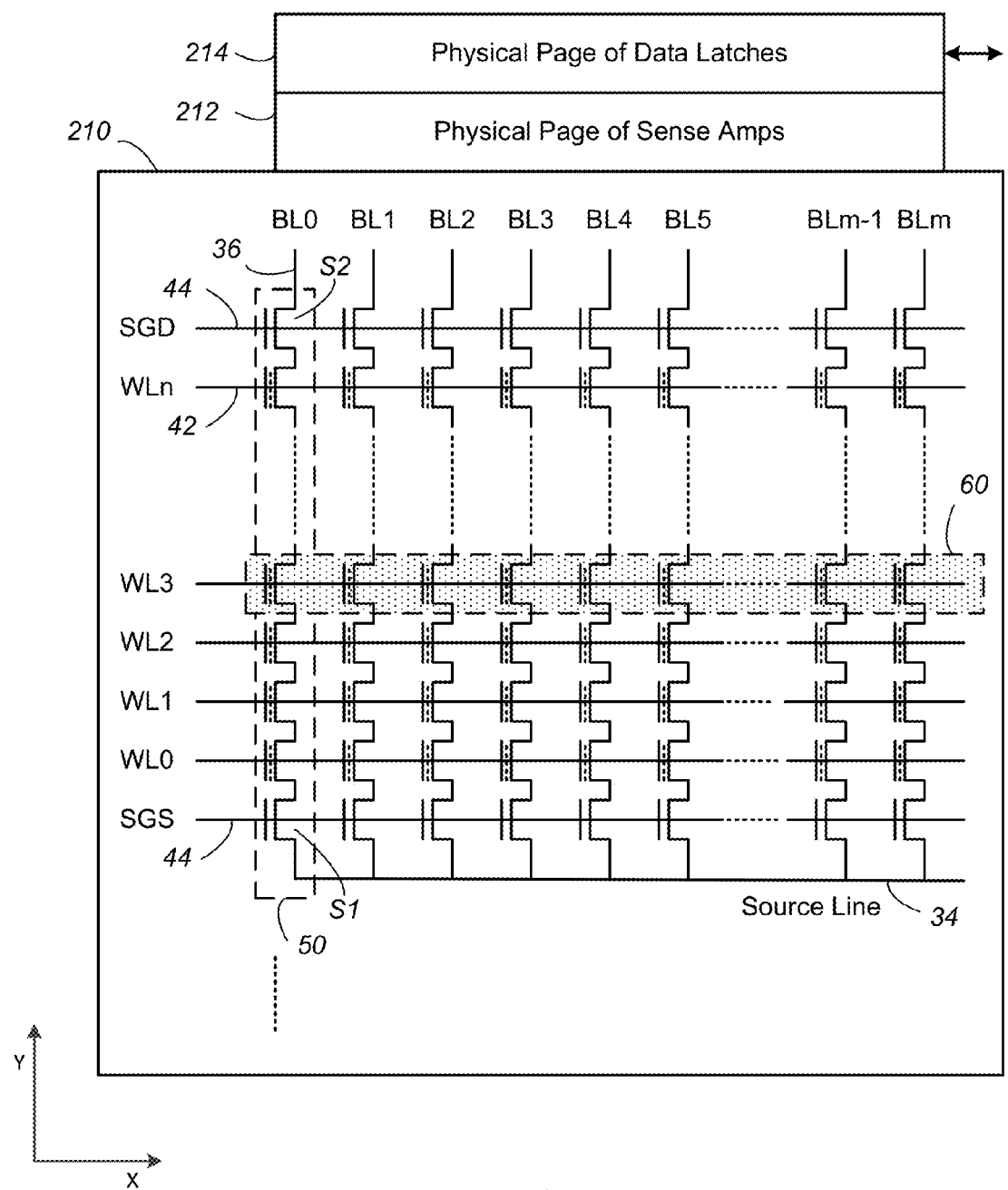
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that update data cannot overwrite existing one and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

FIG. 6A-6C illustrate an example of programming a population of 4-state memory cells. FIG. 6A illustrates the population of memory cells programmable into four distinct distributions of threshold voltages respectively representing memory states "0", "1", "2" and "3". FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 6B will become narrower and the erased state is represented by the "0" state.

A 2-bit code having a lower bit and an upper bit can be used to represent each of the four memory states. For example, the "0", "1", "2" and "3" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three subpasses respectively.

3-D NAND Structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings. Examples of such NAND strings and their formation are described in U.S. Patent Publication Number 2012/0220088 and in U.S. Patent Publication Number 2013/0107628, which are hereby incorporated by reference in their entirety.

Figure 7:
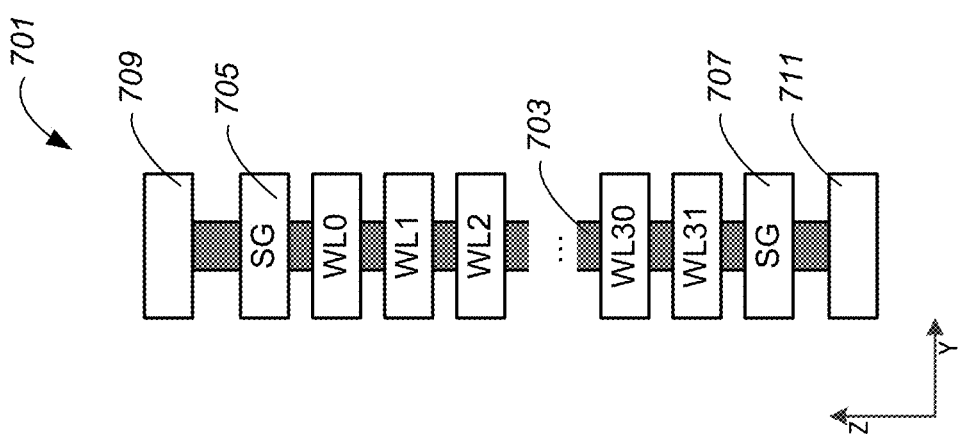
FIG. 7 illustrates an example of a NAND string that extends vertically from a substrate in the z-direction.

FIG. 7 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 7 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

Figure 8:
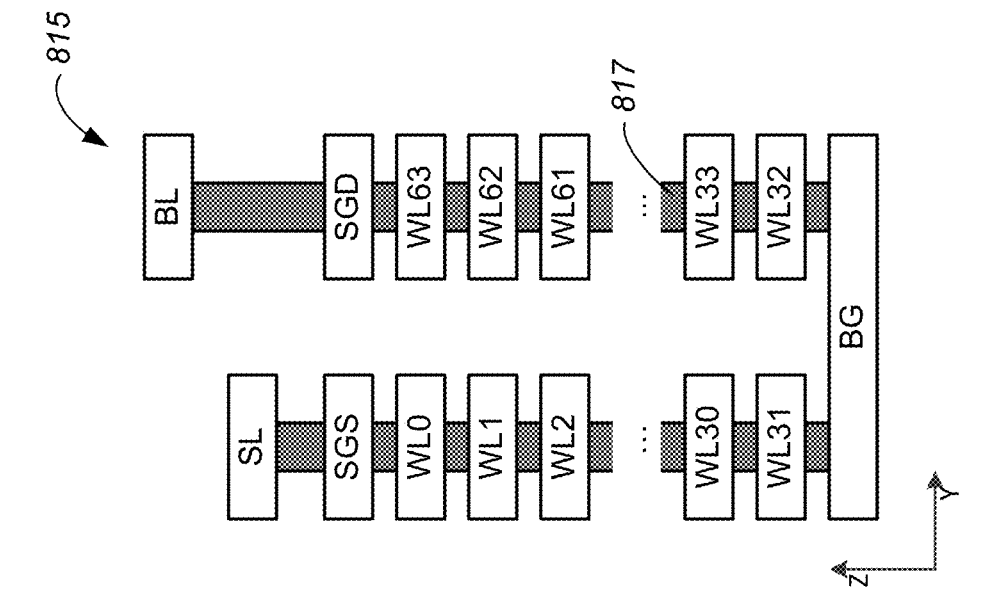
FIG. 8 illustrates another example of a NAND string that extends vertically from a substrate in the z-direction.

FIG. 8 shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two sides of NAND string 815. A total of 64 cells are formed where word lines WL0-WL63 intersect the vertical local bit line 817 (though in other examples other numbers of cells may be provided). Select gates SGS, SGD, are located at either end of NAND string 815 to control connection/isolation of NAND string 815.

Figure 9A:
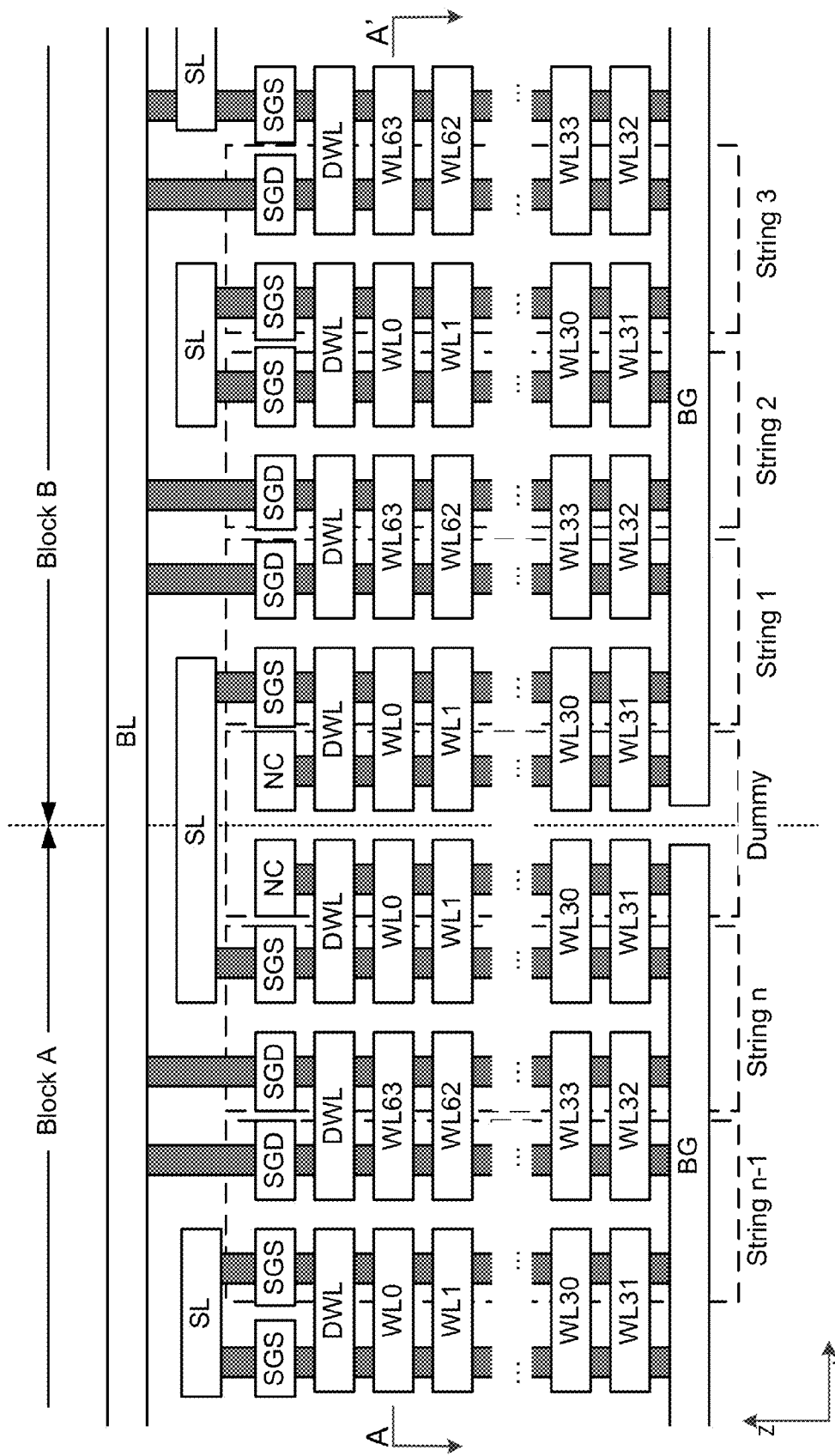
FIG. 9A shows an example of a 3-D NAND memory array in cross section along the y-z plane.

Vertical NAND strings may be arranged to form a 3-D NAND array in various ways. FIG. 9A shows an example where multiple U-shaped NAND strings in a block are connected to a bit line. In this case, there are n strings (Sting 1-String n) in a block connected to a bit line ("BL"). The value of "n" may be any suitable number, for example, 8, 12, 16, 32, or more. Strings alternate in orientation with odd numbered strings having their source connection on the left, and even numbered strings having their source on the right. This arrangement is convenient but is not essential and other patterns are also possible.

FIG. 9A shows where two blocks meet. Block A contains n strings connected to the bit line BL. While only strings n, and n−1 of Block A are shown, it will be understood that the repetitive structure continues to the left where strings 1 to n−2 are located. Block B contains n strings connected to bit line BL. While only strings 1-3 of Block B are shown, it will be understood that the repetitive structure continues to the right where strings 4 to n are located. It will also be understood that the cross section shown is along one of many bit lines that serve the block and that there are many similar bit lines extending along the y-direction, that are separated from each other in the x-direction (e.g. other bit lines behind the bit line shown). Word lines extend in the x-direction, perpendicular to the plane of FIG. 9A, to connect sets of strings of different bit lines. Similarly, select lines extend in the x-direction so that a set of strings may be selectively connected, or isolated, as a unit. In the example shown, word lines are formed so that a single conductive strip forms a word line of two adjacent strings. Thus, for example, in Block B, string 1 and string 2 have word lines WL32-WL63 that are formed by common conductive strips. In contrast, select lines are not shared between neighboring strings. This allows separate selection of an individual set of strings within a block, even though the selected set of strings may include word lines that are not separately controllable from word lines of unselected strings. Various dummy elements may be present where blocks meet including dummy word lines and dummy select lines (marked "NC" for "not connected" because they are not connected to any driver circuits) as shown in FIG. 9A.

Figure 9B:
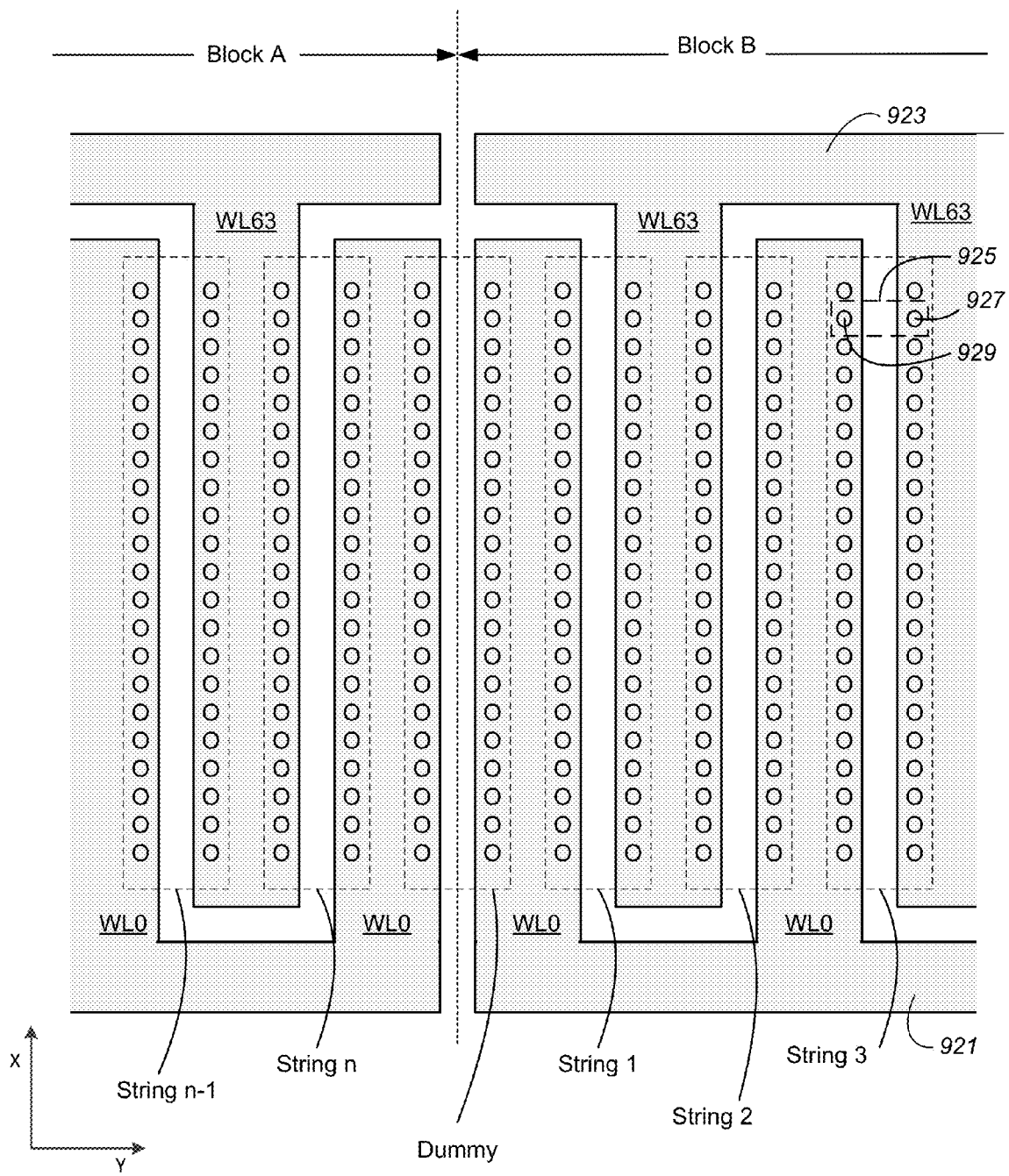
FIG. 9B shows an example of a 3-D NAND memory array in cross section along the x-y plane.

The 3-D NAND memory array of FIG. 9A is further illustrated in FIG. 9B, which shows a cross section along A-A' of FIG. 9A (i.e. along the x-y plane that intersects WL0 and WL63). It can be seen that word lines of a block are formed of strips of conductive material that are connected together. Thus, all word lines marked WL0 in different strings of a block are electrically connected together and are formed from a single electrically conductive body 921. Similarly, all word lines marked WL63 in different strings of a block are electrically connected together and are formed from a single electrically conductive body 923. The two bodies that form word lines of a block on a given level appear as interdigitated fingers extending from opposite sides of the block. These two bodies may be separated by Shallow Trench Isolation (STI) dielectric, or by any suitable insulator. A similar pattern may be found at each level of word lines (e.g. WL1 and WL62 are similarly interdigitated, as are WL2 and WL61, and so on). Word lines of different blocks are isolated from each other. Thus, WL0 of Block A is separate, and electrically isolated from WL0 of Block B. Similarly, WL63 of Block A is separate, and electrically isolated from WL0 of Block B.

Memory holes are shown as circles (memory holes are cylindrical in shape and extend in the z-direction, perpendicular to the cross section shown). A U-shaped NAND string 925 extends along two memory holes 927, 929, with one memory hole 927 passing through body 923 and the other memory hole 929 passing through body 921. A set of strings consists of all such strings that are aligned along the x-direction and that share select lines (which also extend along the x-direction). For example, one such set is made up of all strings indicated by "String 3" in Block B, including string 925. When a given set of strings within a block is selected, a selected word line (or portion of a word line, i.e. a subset of the bit lines that intersect the word line) may be read by applying appropriate word line voltages to the selected word line and to unselected word lines.

Word line drivers are connected to supply appropriate voltages to connected word lines of a block (e.g. to bodies 923 and 921) so that a word line of the block can be accessed (e.g. programmed or read). Select line drivers are connected to supply appropriate voltages to select lines so that a particular set of strings in a block is selected.

Because there are multiple strings along a bit line within a block, it is necessary to specify a particular string when accessing (e.g. reading or programming) the memory. While in 2-D NAND, specifying a block and word line (or portion of a word line) is generally sufficient to specify unique data, in a 3-D structure such as shown above, there may be n different portions of stored data for a given block and word line (where n is the number of strings along a bit line in a block). A set of strings that are selectable together within a block is a unit that is intermediate in size between a single word line and a block. Such a unit arises from particular 3-D memory structures such as the one shown in FIGS. 9A and 9B.

Uncorrectable Data

It is common in memory systems to encode data prior to storage using an Error Correction Code (ECC) scheme. When such data is read it is decoded and errors in the read data may be corrected up to some limit. The limit generally depends on the ECC scheme used and in particular on the amount of redundancy added. While a small number of bad bits may be corrected by ECC, large numbers of bad bits may be uncorrectable by ECC ("UECC") so that some other approach is needed.

One approach to UECC data is to recover the original data from some redundancy data that is generated when the data is stored. Such redundancy data is generated by a separate scheme to the ECC scheme used for small numbers of bad bits. Such redundancy data may allow relatively large portions of data to be reproduced in their entirety if the stored copy becomes UECC. Such redundancy schemes may be costly in terms of the space required and the time necessary to generate redundancy data and to reproduce original when it is needed.

Certain read failure modes are common to both 2-D memories and 3-D memories, while other failure modes are specific to 3-D memories. In general, the arrangement of components in three dimensions gives additional possibilities for short circuits or leakage between components that are designed to be isolated (e.g. because of defects in dielectrics). While a particular line, such as a word line, in a 2-D memory may have a possibility of shorting to neighboring word lines on either side, a line in a 3-D memory could also short to neighbors above or below. In addition, the complex geometry of 3-D memories and the difficult process requirements can make defects more likely in a 3-D memory. While ECC may be able to deal with a small number of bad bits, large groupings of bad bits such as caused by shorted or leaky components may not be correctable by ECC. For example, if a word line is shorted to another component, there may be a large number of bad bits along the word line so that data along the word line may be UECC.

Exclusive OR "XOR"

One system for reproducing original data when a copy in memory is UECC uses redundancy data created by Exclusive OR (XOR) operations applied to multiple portions of data prior to storage. If one of the portions is found to be UECC when it is read from the memory array, the entire portion can be reproduced from the other portions that were XORed together along with the redundancy data generated (i.e. the output of the XOR operation).

FIG. 10 is a schematic illustrating two inputs A and B that are XORed together (subject to an XOR operation) to provide an output C. FIG. 11 shows a truth table for this operation for each possible input combination. It can be seen that the output is 1 whenever only one of the inputs is 1, i.e. when there is an odd input. The output is 0 whenever the inputs are the same, i.e. whenever there is an even input. While output bit C is calculated from input bits A and B, this can be reversed so that knowing output bit C and one of the input bits, the remaining input bit can be calculated.

FIG. 12 illustrates how multi-bit portions of source data A and B may be XORed together to provide output data C. Each bit in output C is calculated by XORing together corresponding bits in source data A and B as shown in FIG. 11. Output data C may be considered as redundancy data that can be stored with source data A and B. Even if one of the portions of data A or B becomes corrupted or otherwise uncorrectable, the original data can be calculated from the other portions of source data and from redundancy data C.

While the example of FIG. 12 shows a set of two portions of source data used to calculate redundancy data, any number of portions may be dealt with in this way. FIG. 13 shows a set of three portions of source data X, Y, and Z which are XORed together to provide redundancy data XOR(X,Y,Z). The XOR operation may be considered to be an addition modulo 2 operation (i.e. summing bits and taking the least significant bit as the output). This can also be considered an odd/even determination with a given output bit indicating whether the sum of all corresponding input bits is odd or even. Any portion of source data can be calculated from the redundancy data XOR(X,Y,Z) and the other portions of source data. This can be extended to any number of portions of source data.

One limitation of an XOR scheme as illustrated above is that in order to calculate any given portion of data the other portions of data in the set of source data must be available. If more than one portion of data in a set of such portions is unavailable (e.g. UECC), then it may not be possible to use the redundancy data to calculate the original data. Therefore, it is important that no more than one portion of data in any set of portions used for calculating redundancy data becomes UECC.

Certain patterns may be observed in UECC data read from a memory array. Some of these patterns are related to the physical structure of the particular memory array in which data is stored. In a 3-D memory array such as described above, it has been found that data becomes UECC in certain patterns that are related to particular failure modes associated with the physical structure described.

Aspects of the present invention relate to selecting portions of data to form a data set for calculation of redundancy data so that the probability of more than one selected portion becoming UECC is low. In particular, such portions may be chosen so that no two such portions are likely to be affected by a common failure mode.

FIG. 14A illustrates an example of a failure mode that may occur in a 3-D memory. Because of a short or leak, or for some other reason, data along a word line WL29 is UECC. In this case, all such word lines (all WL29 word lines in a particular block) are connected together (see FIG. 9B). This means that if data along one such word line is UECC, it is likely that data along other connected word lines is UECC. For example, if data is UECC because the voltage on WL29 is low as the result of a short or leak then because all WL29s are connected, the short or leak will affect all WL29s. Accordingly, a scheme for selecting portions of data to form a set for calculation of redundancy data may avoid selecting portions that lie along connected word lines. Thus, where a first portion of data of the set is from a particular word line, WLX, in a block, subsequent portions may be selected from other word lines, e.g. WLY, where Y≠X. Any subsequently selected portions are from word lines other than WLX and WLY.

Figure 14B:
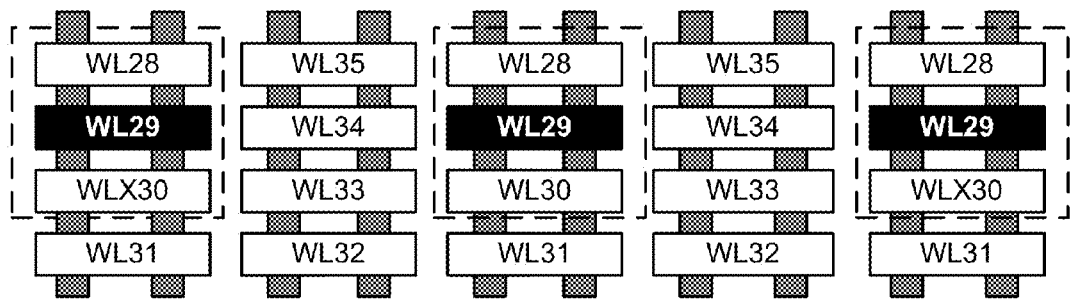
FIG. 14B illustrates another example of a failure mode in a 3-D memory array.

FIG. 14B illustrates another example of a failure mode that may occur in a 3-D memory. In some cases where a word line such as WL29 has a leak or short, it is to a neighboring word line above or below it, i.e. to WL28 or WL30. Thus, if two portions of data in a set used to calculate redundancy data were stored in neighboring word lines this failure mode could cause data of both word lines to be UECC. Accordingly, a scheme for selecting portions of data to form a set for calculation of redundancy data may avoid selecting portions that lie along neighboring word lines. Thus, where a first portion of data of the set is from a particular word line, WLX, in a block, subsequent portions may be selected from other word lines that are separated by at least one intermediate word line, e.g. WLY, where Y≤X−2, or Y≥X+2. Any subsequently selected portions are from word lines separated from both WLX and WLY by at least one intervening word line.

Figure 15:
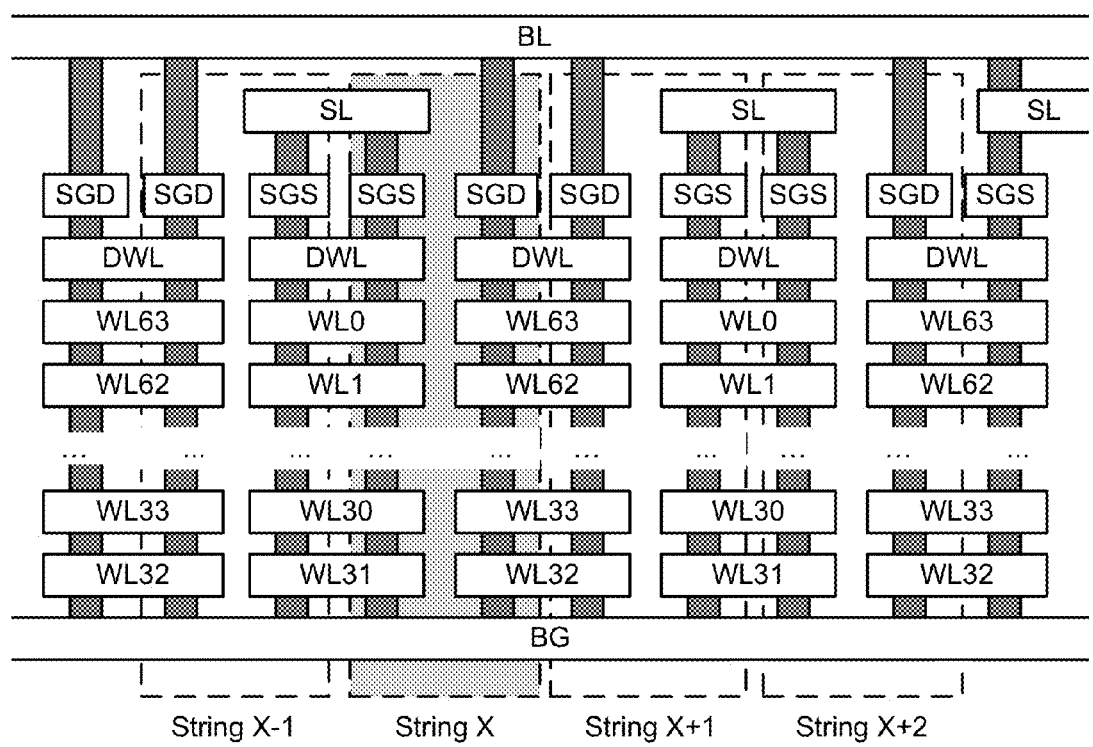
FIG. 15 illustrates another example of a failure mode in a 3-D memory array.

FIG. 15 illustrates another example of a failure mode that may occur in a 3-D memory. In this case a set of strings, String X, is affected. Because a set of strings may be affected by the same failure mode, it is desirable to select portions of data for calculation of redundancy data from different sets of strings. In addition, some failure modes may affect neighboring sets of strings. For example, shorts or leaks between select gates of adjacent sets of strings may affect both sets of stings. If SGD of String X is shorted to SGD of String X+1 then both String X and String X+1 may be affected. Similarly, if SGS of String X is shorted to SGS of String X−1 then both String X and String X−1 may be affected. Accordingly, a scheme for selecting portions of data for calculation of redundancy data may select portions of data that are stored in different strings that are separated by at least one intermediate string. For example, in FIG. 15, if one portion was selected from String X, then subsequent portions of the set would not be selected from String X−1 through String X+1.

Block Selection

In some cases, two or more blocks may share block select circuits. Examples of such shared block select circuits are shown in U.S. Patent Publication No. 2011/0267885. Such paired, or grouped (may more than two) blocks may have particular failure modes that affect a pair or group of blocks as a unit.

Figure 16:
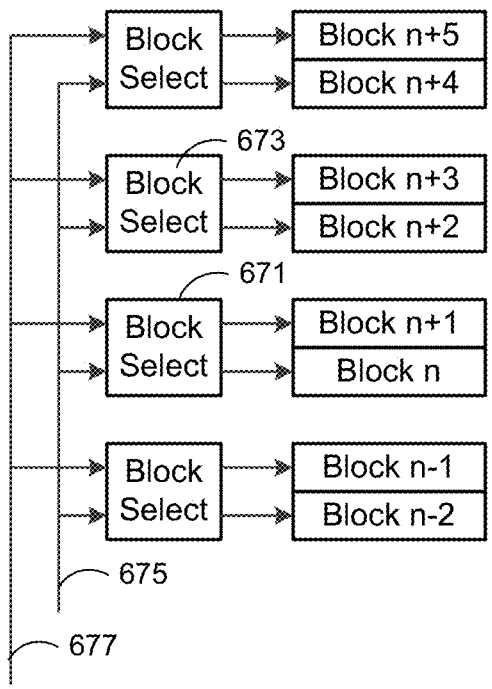
FIG. 16 illustrates how a pair of blocks may share block select circuits.

FIG. 16 shows an example of paired blocks, where each pair of blocks share block select circuits. For example, Block X and Block X+1 share a block select circuit 671. Block X+2 and Block X+3 share a block select circuit 673, and so on. When particular data is accessed, a particular word line, set of strings containing the word line, and block containing the set of strings are selected. Block select circuits connect word lines of the selected block (e.g. Block X) to first global word lines 675 that are biased appropriately with read and read-pass voltages. The shared block select circuits 671 connect word lines of the unselected paired block (e.g. Block X+1) to separate second global word lines 677 that are biased to some low voltage. In some cases, a short or leak between blocks may affect reads in both blocks. For example, it can be seen from FIG. 9A that a short or leak between WL0 of Block X and WL0 of Block X+1 could occur if insulation between blocks was insufficient. Because of the connected word lines within a block, such a defect would affect all strings of the two blocks. For example, in order to read a word line of a string of Block X, it might be necessary to apply a read-pass voltage to WL0. If WL0 of selected Block X leaks to WL0 of unselected Block X+1 (which is typically at some lower voltage than the read-pass voltage) then the effective voltage on WL0 of Block X may not be sufficient to make memory cells along WL0 conductive and may result in UECC data throughout Block X and Block X+1. For blocks that are not paired, word lines of the unselected block would generally be floating (isolated from global word lines) and leakage to such word lines would not significantly affect voltages applied to the selected block.

While this example refers to word lines, shorting of other elements between blocks may also result in UECC data throughout a pair of blocks, for example if back gates of two blocks are shorted this can cause data in both blocks to be UECC. A short between select lines in neighboring blocks that share block select circuits can prevent proper biasing of select lines of both blocks thus making data in both blocks UECC. (A short between select lines of neighboring blocks that do not share block select circuits generally only affects two strings on each block).

Some schemes for selecting data portions for calculation of redundancy data may select from different blocks so that if an entire block is UECC then only one portion of any set is present in the block and the portion can be reproduced from data in other blocks. However, where blocks share block select circuits it may not be sufficient to simply choose a different block. Because certain failure modes may cause two or more blocks to become UECC together, it is desirable to select only blocks that do not share block select circuits. Accordingly, a scheme for selecting portions of data to form a set for calculation of redundancy data selects only portions assigned to blocks that are different to, and do not share block select circuits, with any block containing another portion of the set. So if one portion in a set was chosen from Block n in FIG. 16, subsequent portions would not be chosen from Block n or Block n+1.

Figure 17:
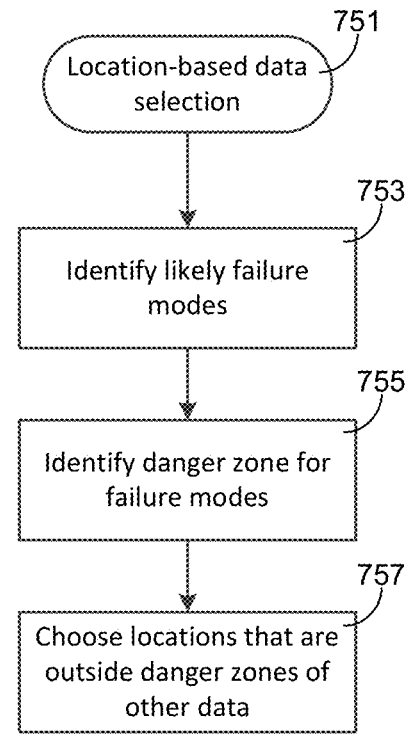
FIG. 17 illustrates a method for location-based selection of data for calculation of redundancy data.

FIG. 17 is a flowchart illustrating a general scheme for selecting portions of data based on their locations 751. It will be understood that calculation of redundancy data is generally performed prior to storing the data in a memory array so selection is based on the location to which the data is assigned even if it is not yet physically programmed at that location. Initially, likely failure modes may be identified for the particular memory array 753. This may depend on the design of the memory array. Failure modes may be predicted from the design or may be found through experiment. One or more danger zones may be identified for the failure modes 755. For example, a danger zone for a particular word line extends to include the word line and its neighbors above and below. Portions of data are then selected so that they are not in the same danger zone as another portion of data of the set 757. This makes it less likely that both portions will become UECC and thus provides a high probability of being to calculate a UECC portion of data.

Figure 18:
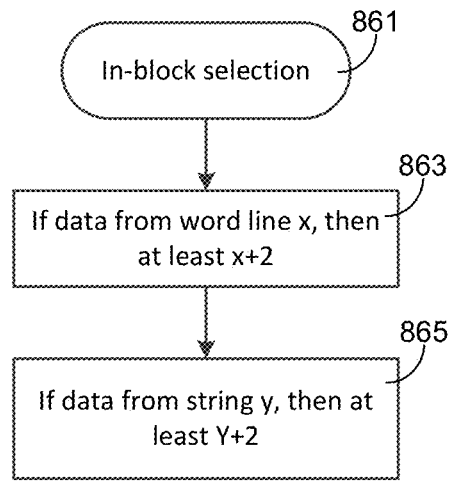
FIG. 18 illustrates a scheme for location-based selection of data for redundancy calculation within a block of 3-D memory.

FIG. 18 is a flowchart for in-block selection of portions of data 861. In this example, all portions of data of a set are selected from within the same block. This is convenient because it allows subsequent calculation of source data without accessing multiple blocks. If a portion of data of the set is assigned to word line X, then a subsequent portion must be at least two word lines away, i.e. at least X+2 (or X−2) 863. If a portion of the set is assigned to a particular set of strings, String Y, then a subsequent portion must be selected from a set of strings at least two strings away, i.e. at least Y+2 (or Y−2) 865.

Figure 19:
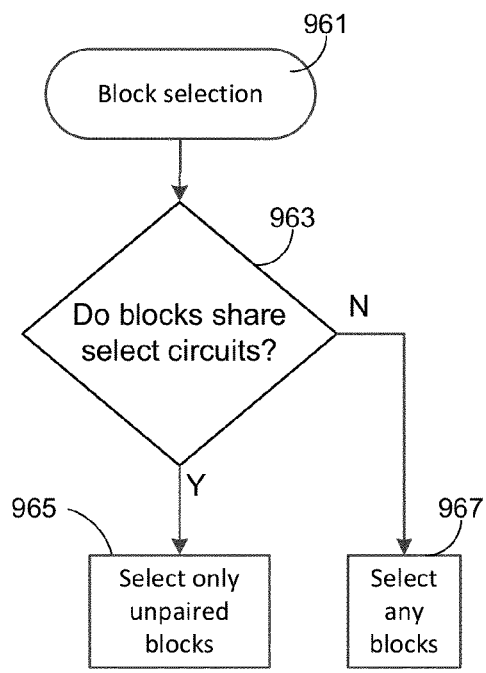
FIG. 19 illustrates a scheme for location-based selection of blocks for redundancy calculation.

FIG. 19 is a flowchart for block selection 961 where different portions are selected from different blocks. This may be used where there is a risk of an entire block becoming UECC, a situation that would not be correctable using an in-block scheme. A determination is made as to whether blocks share block select circuits 963. If block select circuits are shared then selection is performed so that only data portions from unpaired blocks are selected for a given set used for calculation of redundancy data 965. If block select circuits are not paired then any different blocks may be used 967.

Schemes such as in-block XORing and block-to-block XORing may be used separately, or may be used together according to the risks of different failure modes. These may be combined with other schemes including ECC, and any additional redundancy scheme (e.g. a redundancy scheme operated by a host).

While the schemes above refer to selecting portions of source data according to their locations, the location where the redundancy data is stored is also important because the redundancy data must be available in order to reproduce a UECC portion of data. In some cases such redundancy data is stored in a dedicated location, for example a particular portion of the 3-D NAND memory array. One or more blocks may be reserved for storage of redundancy data, or a certain portion of each block may be reserved for storage of redundancy data. In other cases, redundancy data is stored along with source data in the memory array. A scheme for assigning such redundancy data to a location in the memory array may apply the same criteria as applied to select portions of source data. This means that the redundancy data is not is the same danger zone as any of the portions of source data used to calculate it. This reduces the chances of both a portion of source data and the redundancy data becoming UECC at the same time. For example, a location selected for storage of redundancy data may be at least two strings away from any portion of source data, and at least two word lines away from any portion of source data in a block. In another example, a location selected for storage of redundancy data may be in a block that does not have any portion of source data and that does not share block select circuits with any block that has a portion of source data.

Figure 20:
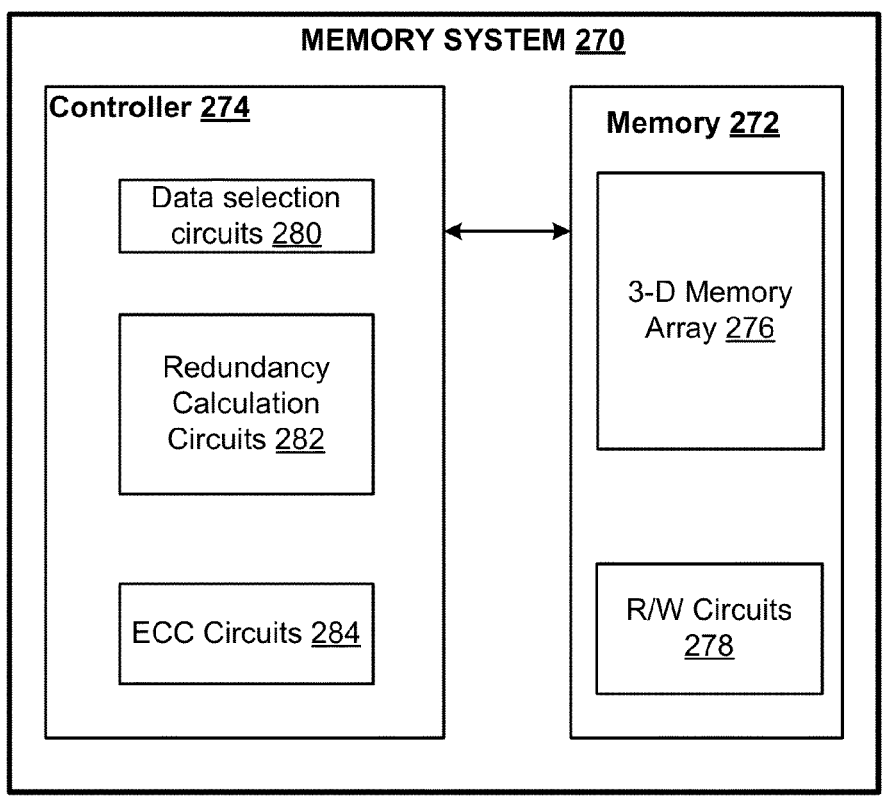
FIG. 20 shows an example of hardware that may be used to implement aspects of the present invention.

FIG. 20 shows an example of hardware that may be used to implement some of the methods described above. In particular, FIG. 20 shows a memory system 270 that includes a memory die 272 and a memory controller die 274. The memory die includes a 3-D memory array 276 and read/write circuits 278. Memory controller die 274 includes data selection circuits 280 that select portions of data according to their assigned locations to form a set for calculation of redundancy data. Redundancy calculation circuits 282 calculate redundancy data from the selected set. The portions of data and the redundancy data are then stored in 3-D memory array 276. ECC circuits 284 also encode data prior to storage and are used to decode the data and correct errors when the data is read. If UECC data is found in a particular portion of data, then read/write circuits 278 read the other portions of data in the set that contains the UECC portion, and read the redundancy data for the set. These are used by redundancy calculation circuits 282 to calculate the source data corresponding to the UECC data. This source data may then be sent to a host and the UECC data in the memory array may be replaced with the correct data.

While the description above refers to particular examples of failure modes, it will be understood that aspects of the invention may be applied to failure modes other than those described. While the description refers to shorts or leaks as examples of failure modes, other defects may also provide failure modes that may be overcome using a suitable redundancy scheme with location based selection of data portions. The examples refer to XOR as an example of an operation for calculation of redundancy data. However, it will be understood that other operations may be used.

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of operating a three dimensional nonvolatile NAND memory in which an individual block contains a plurality of NAND strings connected to each bit line, and in which word lines of different strings along a bit line are connected together, comprising:

receiving portions of data to be stored in the three dimensional nonvolatile NAND memory array;

assigning the portions of data to physical locations for storage in the three dimensional nonvolatile NAND memory array, an individual portion assigned to a location defined by: (i) a block, (ii) a plurality of bit lines that serve the block, (iii) a set of strings selected from a plurality of sets of strings connected to the plurality of bit lines in the block, and (iv) a word line coupled to the set of strings;

selecting a set of two or more portions of data for calculation of redundancy data, the two or more portions of data selected according their assigned physical locations so that none of the two or more portions of data are assigned to connected word lines of different sets of strings of an individual block; and calculating redundancy data for the set of two or more portions of data.

2. The method of claim 1 wherein the set of two or more portions of data are selected according to their assigned locations so that none of the two or more portions of data are assigned to neighboring sets of strings.

3. The method of claim 1 further comprising storing the redundancy data at a physical location that is along a word line that is not connected to a word line containing any of the two or more portions of data.

4. The method of claim 1 wherein the calculating the redundancy data is performed by an exclusive OR (XOR) operation applied to the set of two or more portions of data.

5. The method of claim 1 wherein the selecting of the set of two or more portions selects only portions that are assigned to word lines of the individual block that are vertically separated by at least one intermediate word line.

6. The method of claim 1 further comprising storing the redundancy data at a physical location along a word line that is vertically separated by at least one intermediate word line from any word line along which a portion of the set is stored.

7. The method of claim 1 further comprising encoding the portions of data according to an Error Correction Coding (ECC) scheme prior to storing the portions of data in the three dimensional nonvolatile NAND memory array.

8. The method of claim 7 further comprising:
storing the set of data and the redundancy data in the three dimensional nonvolatile NAND memory;
subsequently reading a first portion of data of the set of data from the three dimensional nonvolatile NAND memory;
attempting to decode the read first portion of data using ECC decoding;
determining that the read first portion of data is uncorrectable by ECC; and
in response, calculating the first portion of data from the redundancy data and the set of data portions other than the first portion.

9. The method of claim 1 wherein the two or more portions of data consists of 3 or 4 portions of data that are subject to an XOR operation to calculate the redundancy data.

10. A three dimensional nonvolatile NAND memory system comprising:
a plurality of individually erasable blocks of memory cells, an individual block containing a plurality of vertical NAND strings along each bit line, each of the plurality of vertical NAND strings served by word lines that are connected to word lines of other vertical NAND strings of the plurality of vertical NAND strings;
redundancy calculation circuits that calculate redundancy data from a set of portions of data; and
data selecting circuits that select portions of data to form sets for calculation of redundancy data according to their physical locations so that no two portions in a set are assigned to word lines that are connected together.

11. The three dimensional nonvolatile NAND memory system of claim 10 wherein the data selecting circuits are further configured to select portions of data to form sets for calculation of redundancy data according to their physical locations so that no two portions in a set are assigned to neighboring sets of strings in a block.

12. The three dimensional nonvolatile NAND memory system of claim 10 wherein the data selecting circuits select portions of data for calculation of redundancy data according to their physical locations so that selected portions are from unconnected word lines that are vertically separated by at least one intermediate word line.

13. The three dimensional nonvolatile NAND memory system of claim 10 wherein the redundancy calculation circuits are exclusive OR (XOR) circuits.

14. The three dimensional nonvolatile NAND memory system of claim 10 further comprising ECC circuits.

15. The three dimensional nonvolatile NAND memory system of claim 10 further comprising additional erase blocks that are dedicated for storage of redundancy data.

16. The three dimensional nonvolatile NAND memory system of claim 10 wherein individual erase blocks contain a mix of redundancy data and other data.

17. A method of operating a three dimensional nonvolatile NAND memory in which an individual block contains multiple NAND strings connected to each bit line, and in which word lines of different strings along a bit line in a block are connected together, comprising:
pairing neighboring NAND blocks so that an unselected NAND block of a pair of NAND blocks is subject to a set of boosting voltages when accessing a selected NAND block of the pair of NAND blocks; and
applying a selection scheme for selecting sets of portions of data for calculating redundancy data, each portion of data in a set selected from a different block that is not paired with any block containing any other portion of data in the set.

18. The method of claim 17 further comprising:
encoding the portions of data according to an ECC scheme prior to storing the portions of data in the three dimensional nonvolatile NAND memory array;
calculating redundancy data for each set of portions of data;
storing the portions of data and the redundancy data in the three dimensional nonvolatile NAND memory;
subsequently reading a portion of data from the three dimensional nonvolatile NAND memory; and
in response to determining that the read first portion of data is uncorrectable by ECC, calculating the first portion of data from the redundancy data and portions of data other than the portion.

19. The method of claim 18 wherein the calculation of the redundancy data is performed prior to the encoding the portions of data according to an ECC scheme.

20. The method of claim 18 wherein the calculating of redundancy data is performed by an XOR operation applied to the set of portions of data.

21. A three dimensional nonvolatile NAND memory system comprising:
a plurality of individually erasable blocks of memory cells, an individual block containing a plurality of vertical NAND strings along each bit line, each of the plurality of vertical NAND strings served by word lines that are connected to word lines of other vertical NAND strings of the plurality of vertical NAND strings;
block select circuits that connect pairs of neighboring blocks to global word lines at the same time, a selected block that connects to first global word lines and an unselected block that is paired with the selected block and that connects to second global word lines;

redundancy calculation circuits that calculate redundancy data from a set of portions of data; and data selecting circuits that select portions of data to form sets for calculation of redundancy data according to their physical locations so that no two portions in a set are assigned to the same block, or to neighboring blocks that form a pair.

22. The three dimensional nonvolatile NAND memory system of claim 21 wherein the redundancy calculation circuits include an XOR circuit that calculates XOR data from the set of portions of data.

23. The three dimensional nonvolatile NAND memory system of claim 21 further comprising ECC circuits.

24. The three dimensional nonvolatile NAND memory system of claim 21 wherein each of the portions of data represents all data of a corresponding block, and wherein portions of data selected to form a set are selected so that none of the blocks corresponding to the portions of data share block select circuits.

25. A method of operating a three dimensional nonvolatile NAND memory in which an individual block contains a plurality of NAND strings connected to each bit line, and in which word lines of different strings along a bit line are connected together, comprising:

receiving portions of data to be stored in the three dimensional nonvolatile NAND memory array;

assigning the portions of data to physical locations for storage in the three dimensional nonvolatile NAND memory array, an individual portion assigned to a location defined by: (i) a block, (ii) a plurality of bit lines that serve the block, (iii) a set of strings selected from a plurality of sets of strings connected to the plurality of bit lines in the block, and (iv) a word line coupled to the set of strings;

selecting a set of two or more portions of data for calculation of redundancy data, the two or more portions of data selected according their assigned physical locations so that none of the two or more portions of data are assigned to neighboring sets of strings in a block; and calculating redundancy data for the set of two or more portions of data.

26. The method of claim 25 further comprising storing the redundancy data at a physical location in a set of strings so that none of the two or more portions of data are assigned to neighboring sets of strings.

27. The method of claim 25 wherein the calculating the redundancy data is performed by an exclusive OR (XOR) operation applied to the set of two or more portions of data.

28. The method of claim 25 wherein the selecting of the set of two or more portions selects only portions that are assigned to word lines of the individual block that are vertically separated by at least one intermediate word line.

29. The method of claim 25 further comprising storing the redundancy data at a physical location along a word line that is vertically separated by at least one intermediate word line from any word line along which a portion of the set is stored.

30. The method of claim 25 further comprising encoding the portions of data according to an Error Correction Coding (ECC) scheme prior to storing the portions of data in the three dimensional nonvolatile NAND memory array.

31. The method of claim 30 further comprising:

storing the set of data and the redundancy data in the three dimensional nonvolatile NAND memory;

subsequently reading a first portion of data of the set of data from the three dimensional nonvolatile NAND memory;

attempting to decode the read first portion of data using ECC decoding;

determining that the read first portion of data is uncorrectable by ECC; and in response, calculating the first portion of data from the redundancy data and the set of data portions other than the first portion.

32. The method of claim 25 wherein the two or more portions of data consists of 3 or 4 portions of data that are subject to an XOR operation to calculate the redundancy data.

33. A three dimensional nonvolatile NAND memory system comprising:

a plurality of individually erasable blocks of memory cells, an individual block containing a plurality of vertical NAND strings along each bit line, each of the plurality of vertical NAND strings served by word lines that are connected to word lines of other vertical NAND strings of the plurality of vertical NAND strings;

redundancy calculation circuits that calculate redundancy data from a set of portions of data; and data selecting circuits that select portions of data to form sets for calculation of redundancy data according to their physical locations so that no two portions in a set are assigned to neighboring sets of strings in a block.

34. The three dimensional nonvolatile NAND memory system of claim 30 wherein the data selecting circuits select portions of data for calculation of redundancy data according to their physical locations so that selected portions are from unconnected word lines that are vertically separated by at least one intermediate word line.

35. The three dimensional nonvolatile NAND memory system of claim 30 wherein the redundancy calculation circuits are exclusive OR (XOR) circuits.

36. The three dimensional nonvolatile NAND memory system of claim 30 further comprising ECC circuits.

37. The three dimensional nonvolatile NAND memory system of claim 30 further comprising additional erase blocks that are dedicated for storage of redundancy data.

38. The three dimensional nonvolatile NAND memory system of claim 30 wherein individual erase blocks contain a mix of redundancy data and other data.

* * * * *